United States Patent
Noh et al.

(10) Patent No.: US 7,511,423 B2
(45) Date of Patent: Mar. 31, 2009

(54) ORGANIC LIGHT EMITTING DEVICE (OLED) AND WHITE LIGHT EMITTING DEVICE

(75) Inventors: Tae-Yong Noh, Gunpo-si (KR);
Euk-Che Hwang, Osan-si (KR);
Jong-Jin Park, Guri-si (KR);
Young-Hun Byun, Yongin-si (KR);
Jhun-Mo Son, Yongin-si (KR);
Sung-Hun Lee, Seoul (KR); Sang-Hoon Park, Seongnam-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 385 days.

(21) Appl. No.: 11/345,241

(22) Filed: Feb. 2, 2006

(65) Prior Publication Data

US 2006/0175960 A1 Aug. 10, 2006

(30) Foreign Application Priority Data

Feb. 5, 2005 (KR) .................. 10-2005-0010989

(51) Int. Cl.
*H01J 1/62* (2006.01)
*H05B 33/00* (2006.01)
*H01J 63/04* (2006.01)
*H01L 31/00* (2006.01)

(52) U.S. Cl. .............. 313/507; 315/500; 315/169.3; 313/493; 313/506; 313/504

(58) Field of Classification Search .............. None
See application file for complete search history.

(56) References Cited

U.S. PATENT DOCUMENTS

| 2002/0167280 | A1* | 11/2002 | Hayashi et al. | 315/169.3 |
|---|---|---|---|---|
| 2003/0213967 | A1* | 11/2003 | Forrest et al. | 257/96 |
| 2004/0021434 | A1* | 2/2004 | Yoneda | 315/504 |
| 2005/0040753 | A1* | 2/2005 | Osame et al. | 313/500 |

FOREIGN PATENT DOCUMENTS

| CN | 1402958 | 3/2003 |
|---|---|---|
| WO | WO 01/24586 | 4/2001 |

OTHER PUBLICATIONS

Mark et al., Progress in high work function TCO OLED anode alternatives and OLED nanopixelation, Synthetuc Metals, 2002, vol. 127, pp. 29-34.*

Office action from the Chinese Patent Office issued in Applicant's corresponding Chinese Patent Application No. 2006100061829 dated Oct. 10, 2008.

* cited by examiner

*Primary Examiner*—Sikha Roy
*Assistant Examiner*—Tracie Y Green
(74) *Attorney, Agent, or Firm*—Robert E. Bushnell, Esq.

(57) ABSTRACT

An organic light emitting device (OLED) and a white light emitting device are provided. The OLED includes a substrate, a mesh shaped anode formed on the substrate and designed to pass light, a cathode facing the anode, and an organic light emitting layer located between the anode and the cathode.

14 Claims, 4 Drawing Sheets

ORGANIC LIGHT EMITTING DEVICE (OLED) AND WHITE LIGHT EMITTING DEVICE

CLAIM OF PRIORITY

This application makes reference to, incorporates the same herein, and claims all benefits accruing under 35 U.S.C. § 119 from an application earlier filed in the Korean Intellectual Property Office on 5 Feb. 2005 and there duly assigned Serial No. 10-2005-0010989.

BACKGROUND OF THE INVENTION

1. Field of the Invention

The present invention relates to an Organic Light Emitting Device (OLED) and a white light emitting device, and more particularly, to an OLED that uses pattern electrodes, and a white light emitting device using the OLED.

2. Description of the Related Art

OLEDs have received much attention due to their suitability for color display devices. OLEDs are emissive display devices that emit light using an organic compound. They are thin, and compared to TFT-LCDs, have lower manufacturing costs, lower power consumption, and quicker response time, due to their simple structure and manufacturing process.

A surface light emitting OLED includes an ITO transparent anode on a glass substrate, a Hole Transfer Layer formed on the ITO transparent anode, an active layer formed on the HTL, an Electron Transfer Layer formed on the active layer, and an Al cathode formed on the ETL. The OLED emits light by generating excitons by recombining holes injected from the ITO transparent anode and electrons injected from the Al cathode in the active layer formed of an organic material. The light is emitted directly to the outside, or reflected by the Al cathode through the ITO transparent anode and the glass substrate.

Such an OLED can have defects at the surface where the HTL contacts the ITO transparent anode due to the surface contacting structure of the OLED, and these defects reduce the lifetime of the OLED. Also, a portion of the light emitted from the light emitting layer is absorbed while passing through the anode.

SUMMARY OF THE INVENTION

The present invention provides an OLED that reduces device defects and allows more latitude for selecting an electrode material, by forming mesh shaped electrodes designed to pass light using a simple wet process, instead of a deposition method which is complicated and expensive.

The present invention also provides a white light emitting device having the OLEDs.

According to one aspect of the present invention, an Organic Light Emitting Device (OLED) is provided including: a substrate; a mesh shaped anode arranged on the substrate and between the anode and the cathode.

The cathode is preferably a mesh shaped cathode adapted to pass light.

The organic light emitting layer preferably includes: a hole transfer layer; an active layer arranged on the hole transfer layer; and an electron transfer layer arranged on the active layer.

The substrate preferably includes glass or a plastic.

The mesh shaped anode preferably includes a metal selected from the group consisting of Ni, Au, Ag, Pt, and Cu. The mesh shaped anode preferably includes a metal having a work function greater than 4.8 eV. The mesh shaped anode is preferably formed by a wet process.

The wet process preferably includes: forming an optical catalyst film by coating an optical catalyst material on a substrate; forming a water soluble polymer layer by coating a water soluble polymer compound on the optical catalyst film; producing a latent pattern of nuclei for growing crystals by selectively exposing the optical catalyst film and the water soluble polymer layer; and producing a metal pattern by plating the latent pattern of nuclei, and growing metal crystals.

According to another aspect of the present invention, a double-sided light emitting Organic Light Emitting Device (OLED) is provided including: a substrate; a mesh shaped anode arranged on the substrate and adapted to pass light; a mesh shaped cathode facing the mesh shaped anode and adapted to pass light; and an organic light emitting layer arranged between the mesh shaped anode and the mesh shaped cathode.

According to yet another aspect of the present invention, a white light emitting device having first, second, and third stacked Organic Light Emitting Devices (OLEDs) is provided, wherein each of the first and second OLEDs includes: a substrate; a mesh shaped anode arranged on the substrate and adapted to pass light; a mesh shaped cathode facing the mesh shaped anode and adapted to pass light; and an organic light emitting layer arranged between the mesh shaped anode and the mesh shaped cathode; and wherein the third OLED includes: a substrate; a mesh shaped anode arranged on the substrate and adapted to pass light; a cathode facing the mesh shaped anode; and an organic light emitting layer arranged between the mesh shaped anode and the cathode; wherein the first, second, and third OLEDs respectively generate red, green, and blue light.

The mesh pattern of the mesh shaped anodes of each of the OLEDs is preferably out of line with each other.

Each organic light emitting layer preferably includes: a hole transfer layer; an active layer arranged on the hole transfer layer; and an electron transfer layer arranged on the active layer.

Each substrate preferably includes glass or a plastic.

Each mesh shaped anode preferably includes a metal selected from the group consisting of Ni, Au, Ag, Pt, and Cu. Each mesh shaped anode preferably includes a metal having a work function greater than 4.8 eV. Each mesh shaped anode and mesh shaped cathode are formed by a wet process.

The wet process preferably includes: forming an optical catalyst film by coating an optical catalyst material on a substrate; forming a water soluble polymer layer by coating a water soluble polymer compound on the optical catalyst film; producing a latent pattern of nuclei for growing crystals by selectively exposing the optical catalyst film and the water soluble polymer layer; and producing a metal pattern by plating the latent pattern of nuclei, and growing metal crystals.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
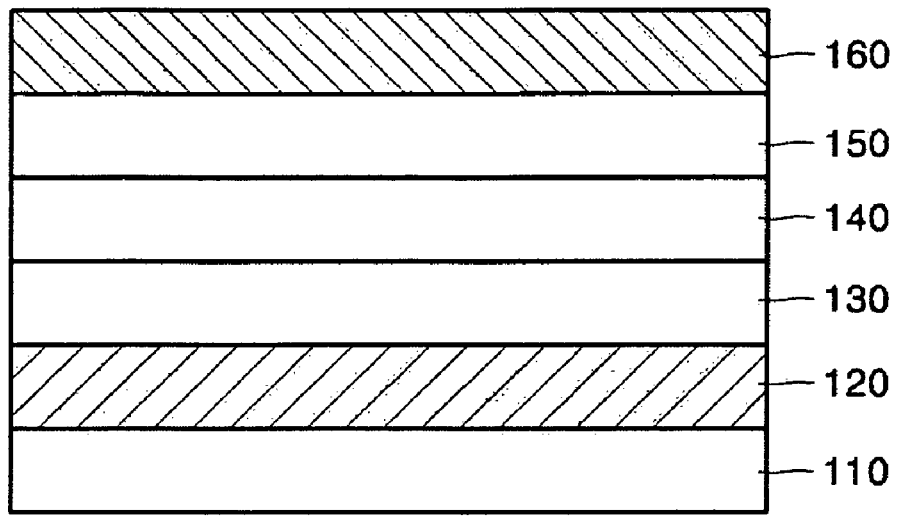
FIG. 1 is a cross-sectional view of a surface light emitting Organic Light Emitting Device (OLED)

FIG. 1 is a cross-sectional view of a surface light emitting Organic Light Emitting Device (OLED).

Referring to FIG. 1, the OLED includes an ITO transparent anode 120 on a glass substrate 110, a Hole Transfer Layer (HTL) 130 formed on the ITO transparent anode 120, an active layer 140 formed on the HTL 130, an Electron Transfer Layer (ETL) 150 formed on the active layer 140, and an Al cathode 160 formed on the ETL 150. The OLED emits light by generating excitons by recombining holes injected from the ITO transparent anode 120 and electrons injected from the Al cathode 160 in the active layer 140 formed of an organic material. The light is emitted directly to the outside, or reflected by the Al cathode 160 through the ITO transparent anode 120 and the glass substrate 110.

Figure 2:
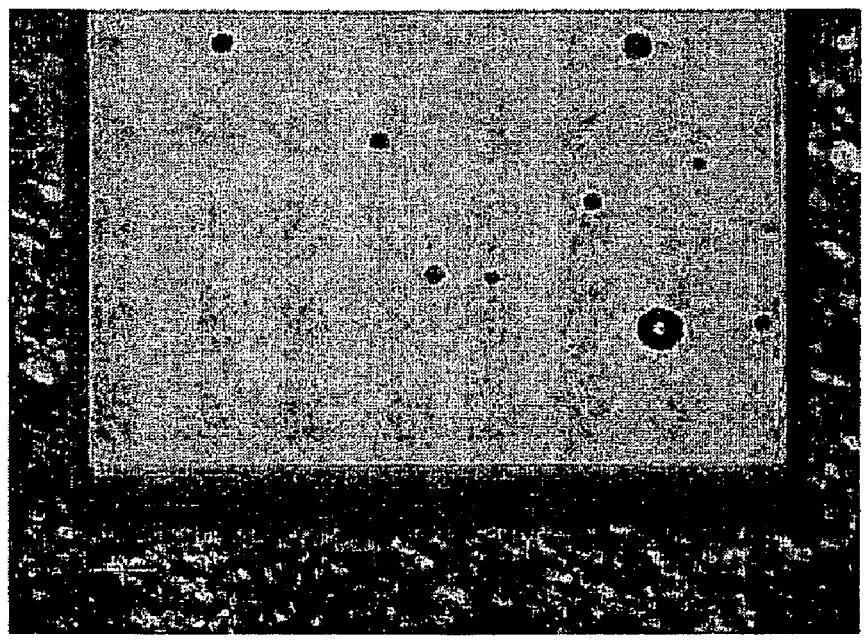
FIG. 2 is a photograph of surface defects of a surface light emitting OLED such as that of FIG. 1.

FIG. 2 is a photograph of surface defects of a surface light emitting OLED such as that of FIG. 1. Referring to FIG. 2, the OLED can have defects at the surface where the HTL 130 contacts the ITO transparent anode 120 due to the surface contacting structure of the OLED, and these defects reduce the lifetime of the OLED. Also, a portion of the light emitted from the light emitting layer is absorbed while passing through the anode.

An OLED and a white light emitting device according to the present invention is described more fully below with reference to the accompanying drawings in which exemplary embodiments of the present invention are shown.

Figure 3:
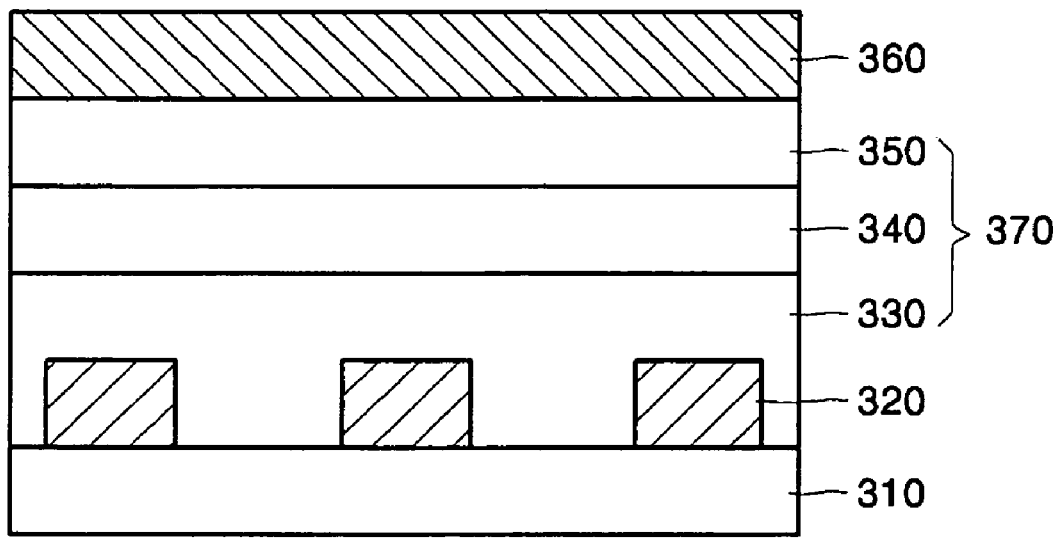
FIG. 3 is a cross-sectional view of an OLED according to an embodiment of the present invention.

FIG. 3 is a cross-sectional view of an OLED according to an embodiment of the present invention.

Referring to FIG. 3, the OLED includes a mesh shaped anode 320 located on a substrate 310 and designed to pass light, a cathode 360 facing the mesh shaped anode 320, and an organic light emitting layer 370 arranged between the mesh shaped anode 320 and the cathode 360.

The substrate 310 is formed of a material having good surface uniformity, high mechanical strength, and high light transmission, to use for a display. The substrate 310 can be formed of glass or a transparent plastic.

The mesh shaped anode 320 is formed of a material that allows smooth current flow even though it is opaque, since light generated by the organic light emitting layer 370 can be emitted to the outside through spaces between the ribs of the mesh. The mesh can take any form, such as a net shape, a comb shape, or a honeycomb shape, as long as light can pass through the spaces in the mesh. The brightness of the device can be controlled through controlling a driving voltage, the gaps in the mesh, and the mesh thickness. The width of the mesh shaped anode is roughly 100 μm and less, and the distance between the adjacent ribs of the mesh is roughly 1 μm and more.

If the mesh shaped anode 320 is formed by a wet process including: coating an optical catalyst film, such as a TiOx material on a substrate; selectively yielding a latent image by exposing the optical catalyst film to light; and electroless plating on the latent image, then the mesh shaped anode 320 can be formed of at least one material that can be electroless plated, such as Pd, Ni, Au, Ag, Pt, or Cu, or a metal having a work function greater than 4.8 eV.

Figure 4:
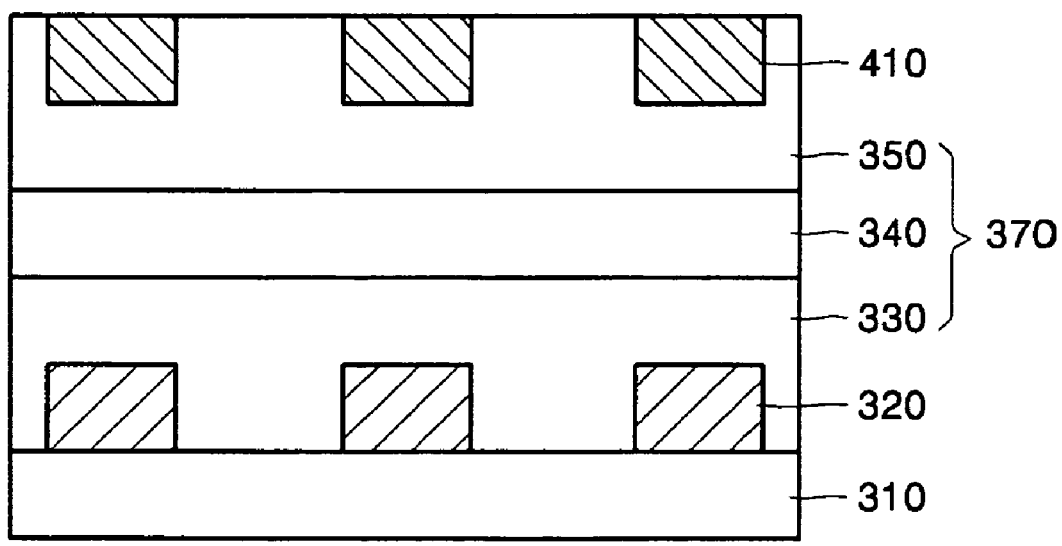
FIG. 4 is a cross-sectional view of a double sided light emission OLED according to an embodiment of the present invention.

Referring to FIG. 4, if a cathode 410 is a mesh shaped electrode designed to pass light corresponding to the mesh shaped anode 320, an OLED having the cathode 410 can be used as a double-sided light emitting device. The cathode 410 is generally formed of a material having a low work function, such as an Mg—Ag alloy or an Al—Li alloy.

The organic light emitting layer 370 includes a Hole Transfer Layer (HTL) 330, an active layer 340 located on the HTL 330, and an Electron Transport Layer (ETL) 350 located on the active layer 340.

The HTL 330 is composed of at least one of a Hole Injection Layer (HTL), a HTL, and an Electron Blocking Layer (EBL). Also, the HTL 330 can be formed using electron donor molecules having low ionization potential, such as diamine, triamine, and tetraamine based on triphenylamine, to facilitate the hole injection from the mesh shaped anode 320.

The active layer 340 generates light of various colors by recombining the injected holes and electrons, and can be formed of a low molecular weight compound or a polymer.

The ETL 350 is composed of at least one of an ETL, an EIL, and an HBL. The ETL 350 increases the opportunity for recombining of the holes and electrons in the active layer 340, by smoothly transporting the electrons supplied from the cathode to the active layer, and by encouraging the migration of the uncombined holes in the active layer 340. The ETL 350 can be formed of a material having high electron affinity and high adhesion to the cathode that injects electrons into the active layer, such as PBD or Alq3.

Figure 5:
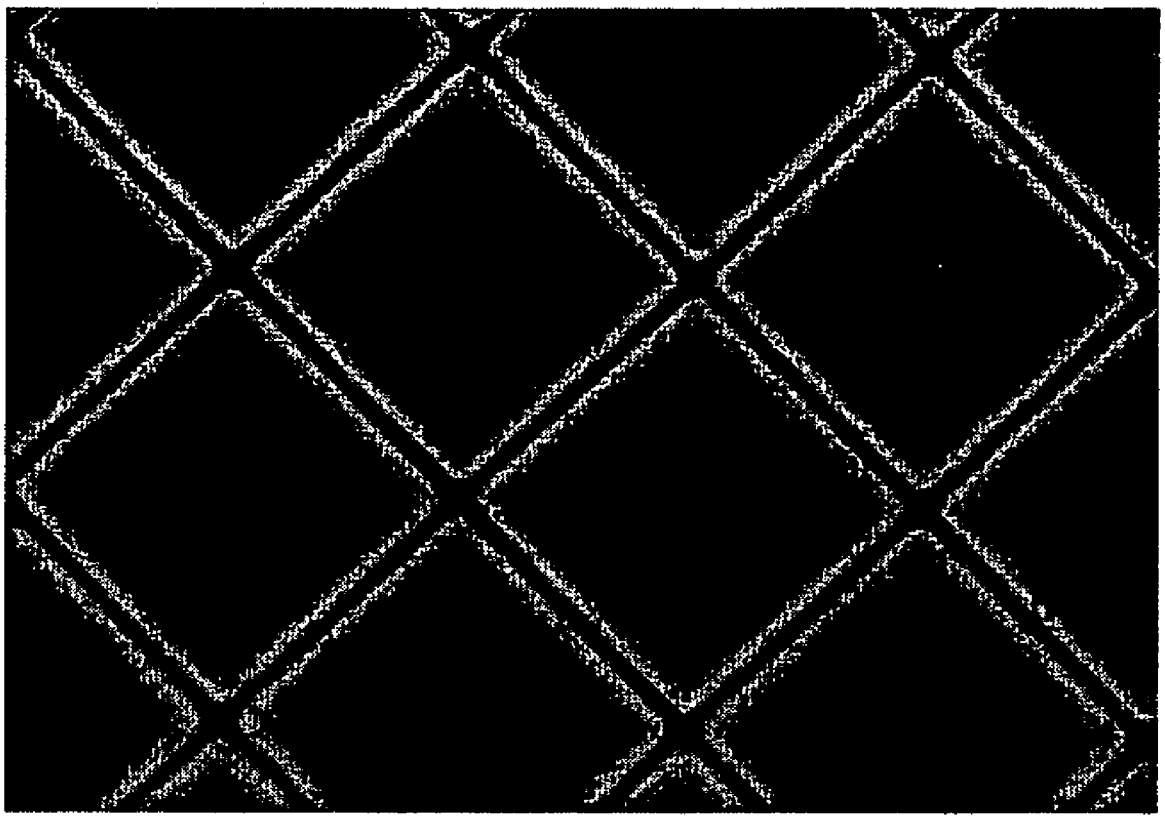
FIG. 5 is a photograph of a mesh shaped anode manufactured by a wet process, and light emission from an OLED formed of the mesh shaped anode according to an embodiment of the present invention.

FIG. 5 is a photograph of a mesh shaped anode manufactured by a wet process, and light emission from an OLED formed of the mesh shaped anode according to an embodiment of the present invention.

The metal patterns of the mesh shaped anode and the cathode are formed by a wet process. The method of forming the metal patterns includes: (i) forming an optical catalyst film by coating an optical catalyst compound on a substrate; (ii) forming a water soluble polymer layer by coating a water soluble compound; (iii) producing a latent pattern of nuclei for growing crystals by selectively exposing the optical catalyst film and the water soluble polymer layer; and (iv) producing a metal pattern by plating the latent pattern of nuclei for growing crystals and growing metal crystals.

Referring to FIG. 5, the OLED according to the present embodiment has fewer surface defects than the surface light emitting OLED such as that of FIG. 1. and has similar brightness to the surface light emitting OLED of FIG. 1. The mesh shaped metal electrode is efficiently and rapidly formed by a simple process, instead of needing a metal thin film process that requires a high vacuum and a high temperature or an exposing process for fine shaping the electrode and an etching process.

According to an embodiment of the present invention, the formation of the anode in a mesh shape can reduce the contact surface between the anode and the organic light emitting layer, compared to the surface light emitting OLED. Also, a structure in which light is emitted to the outside through spaces in the mesh gives more latitude for selecting the anode material. Incidentally, the stacked structure of the OLED can be formed not only by an existing batch process, but also a roll to roll process. Therefore, a variety of processes can be applied to manufacture the OLED.

Figure 6:
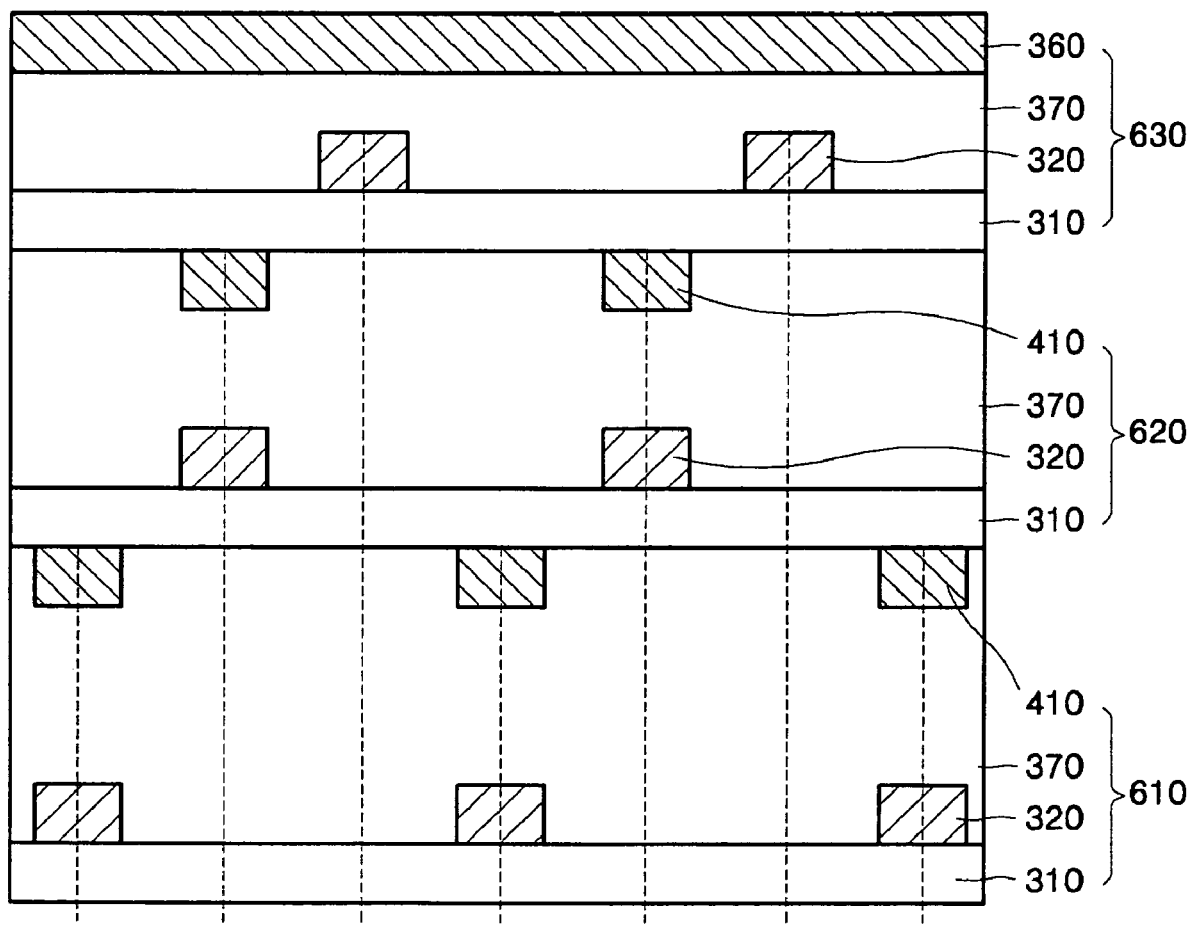
FIG. 6 is a cross-sectional view of a white light emitting device that emits white light from sequentially stacked OLEDs according to an embodiment of the present invention.

FIG. 6 is a cross-sectional view of a white light emitting device that emits white light from sequentially stacked OLEDs according to an embodiment of the present invention. In FIGS. 3, 4, and 6, elements which perform the same function are assigned the same reference numerals.

Referring to FIG. 6, a white light emitting device according to an embodiment of the present invention includes a first organic light emitting unit 610, a second organic light emitting unit 620 stacked on the first organic light emitting unit 610, and a third organic light emitting unit 630 stacked on the second organic light emitting unit 620. Each of the first and second organic light emitting units 610 and 620 includes: a mesh shaped anode 320 formed on a substrate 310 and designed to pass light; a mesh shaped cathode 410 facing the mesh shaped anode 320 and designed to pass light; and an organic light emitting layer 370 between the mesh shaped anode 320 and the mesh shaped cathode 410. The third organic light emitting unit 630 includes: the mesh shaped anode 320; a cathode 360 facing the mesh shaped anode 320; and the organic light emitting layer 370 between the mesh shaped anode 320 and the cathode 360. Each of the organic light emitting units 610, 620, and 630 respectively emits light of different colors.

Each of the first and second organic light emitting units 610 and 620 is a double-sided light emitting type. Light emitted from each of the organic light emitting layers 370 can pass through the spaces between the ribs of the mesh of each of the electrodes. The third organic light emitting unit 630 is a single-side light emitting type, and when it is stacked on the second organic light emitting unit 620 such a way that the substrate 310 of the third organic light emitting unit 630 can contact the organic light emitting layer 370 of the second organic light emitting unit 620, light emitted from each of the organic light emitting layers 370 is emitted away from the cathode 360 of the third organic light emitting unit 630 using the cathode 360 as a reflection surface. When the first, second, and third organic light emitting units respectively emit red, green and blue light, regardless of the order, the white light emitting device emits white light to the outside. Each mesh pattern of the mesh shaped anodes 320 of the first through third organic light emitting units 610, 620, and 630 can be out of line with each other to facilitate the emission of light through spaces in the mesh and to mix the light emitted from the organic light emitting layers 370.

The white light emitting device according to the present invention has fewer defects than an OLED that emits red, green and blue light on the same plane, thereby increasing the lifespan of the white light emitting device.

An example of the present invention is described in detail below. However, the present invention is not limited thereto.

EXAMPLE

Formation of a Mesh Shaped Metal Anode

An isopropanol solution (2.5 wt %) of polybutyltitanate is coated on a transparent polyester film using spin coating. The thickness of the transparent polyester film is controlled to approximately 100 nm by drying at a temperature of 150° C. for 5 minutes. An aqueous solution of polyvinyl alcohol polymer (molecular weight is 25,000) of 5 wt %, a product of Polyscience Co., is prepared. After adding triethanol amine (1 wt % with respect to the polymer) as a photo intensifier to the aqueous solution and mixing, the solution is coated on a piece of the polybutyltitanate, and dried at a temperature of 60° C. for 2 minutes. The optical catalyst film is exposed to broad spectrum ultraviolet rays through a photomask on which a fine pattern is formed, using an UV exposing apparatus manufactured by Oriel Inc. U.S.A., for example. After the optical catalyst film is exposed to the ultraviolet rays, the resultant product is soaked in a solution made by diluting 0.6 g of $PdCl_2$ and 1 ml of HCL in 1 liter of water to form a negative pattern of nuclei for growing crystals by precipitating Pd particles on the exposed surface of the optical catalyst film.

A metal wiring is selectively grown by soaking the prepared substrate in an electroless Ni plating solution of table 1 using a photomask on which a mesh pattern is formed. The physical properties of the resulting pattern are summarized in table 2. At this time, the thickness is measured by a a-step of Dektak Co., for example, the specific resistance is measured by a four-point probe, the resolution is measured by an optical microscope, and the adhesion force is evaluated by a scotch tape exfoliation test. FIG. 5 is an optical microscope image of light emission from an OLED formed with the mesh shaped metal pattern.

TABLE 1

| Electroless Ni plating solution | |
| --- | --- |
| $NiCl_2 6H_2O$ | 10 g |
| $NaH_2PO_2 2H_2O$ | 30 g |

TABLE 2

| Thickness of metal (μm) | Specific resistance (μΩ · cm) | Resolution (μm) | Adhesion force |
| --- | --- | --- | --- |
| 1.0 | 2.0 | <8 | favorable |

Example 1

Manufacturing a Patterned OLED

After cleaning a transparent glass substrate on which ITO is coated, and the substrate on which the mesh shaped metal pattern is formed, the substrates are surface treated with UV-Ozone for 15 minutes.

Baytron P AI4083 (a product of Bayer Inc.), for example, which is a commercial name for PEDOT, is coated on the upper part of the metal electrode to a thickness of 50-110 nm. Next, a hole transfer layer (HTL) is formed by baking the resultant product at a temperature of 110° C. for approximately 10 minutes.

A composite for forming a light emitting layer is made by diluting TS-9, which is a polyfluorene polymer, in 10 g of chlorobenzene (solvent), and then filtered with a 0.2 μm filter before being coated on the upper part of the HTL using a spin coating method. After baking the resultant product, a light emitting layer is formed by completely removing the solvent in a vacuum oven. The thickness of the light emitting layer is controlled to 50-100 nm by controlling the concentration of the composite and the spin speed.

Next, the manufacture of an OLED is completed by forming a cathode on the upper part of the light emitting layer by sequentially depositing films of Ca and Al in a vacuum chamber in which the pressure is maintained at $1 \times 10^{-6}$ torr or less. The thickness of the film and the film growing speed are controlled by using a crystal sensor.

The electroluminescent (EL) device manufactured as above is a multi-layer type device having the structure of an ITO electrode or a mesh shaped metal pattern/a hole transfer layer/a light emitting polymer/Ca/Al. The light emission of a device formed on the ITO electrode is shown in FIG. 2, and the light emission of a device formed of the patterned mesh shaped metal electrode is shown in FIG. 6.

As described above, an OLED according to the present invention reduces device defects, increases the lifespan of the device, and provides more latitude for selecting an electrode material by forming the electrode in a mesh shape. According to the present invention, a new structure of a white light emitting device can be obtained by stacking the OLED having the above structure.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A white light emitting device having first, second, and third stacked Organic Light Emitting Devices (OLEDs), wherein each of the first and second OLEDs comprises:
    a substrate;
    a mesh shaped anode arranged on the substrate and adapted to pass light;
    a mesh shaped cathode facing the mesh shaped anode and adapted to pass light; and
    an organic light emitting layer arranged between the mesh shaped anode and the mesh shaped cathode; and
    wherein the third OLED comprises:
    a substrate;
    a mesh shaped anode arranged on the substrate and adapted to pass light;
    a cathode facing the mesh shaped anode; and
    an organic light emitting layer arranged between the mesh shaped anode and the cathode;
    wherein the first, second, and third OLEDs respectively generate red, green, and blue light;
    wherein the mesh pattern of the mesh shaped anodes of each of the OLEDs is out of line with each other.

2. The white light emitting device of claim 1, wherein each organic light emitting layer comprises:
    a hole transfer layer;
    an active layer arranged on the hole transfer layer; and
    an electron transfer layer arranged on the active layer.

3. The white light emitting device of claim 1, wherein each substrate comprises glass or a plastic.

4. The white light emitting device of claim 1, wherein each mesh shaped anode comprises a metal selected from the group consisting of Ni, Au, Ag, Pt, and Cu.

5. The white light emitting device of claim 1, wherein each mesh shaped anode comprises a metal having a work function greater than 4.8 eV.

6. The white light emitting device of claim 1, wherein each mesh shaped anode and mesh shaped cathode are formed by a wet process.

7. The white light emitting device of claim 6, wherein the wet process comprises:
    forming an optical catalyst film by coating an optical catalyst material on a substrate;
    forming a water soluble polymer layer by coating a water soluble polymer compound on the optical catalyst film;
    producing a latent pattern of nuclei for growing crystals by selectively exposing the optical catalyst film and the water soluble polymer layer; and
    producing a metal pattern by plating the latent pattern of nuclei, and growing metal crystals.

8. A light emitting device having first, second, and third stacked Organic Light Emitting Devices (OLEDs), wherein each of the first and second OLEDs comprises:
    a substrate;
    a mesh shaped anode arranged on the substrate and adapted to pass light;
    a mesh shaped cathode facing the mesh shaped anode and adapted to pass light; and
    an organic light emitting layer arranged between the mesh shaped anode and the mesh shaped cathode; and
    wherein the third OLED comprises:
    a substrate;
    a mesh shaped anode arranged on the substrate and adapted to pass light;
    a cathode facing the mesh shaped anode; and
    an organic light emitting layer arranged between the mesh shaped anode and the cathode;
    wherein the first, second, and third OLEDs respectively emits three different color lights; and
    wherein the mesh pattern of the mesh shaped anodes of each of the OLEDs is out of line with each other.

9. The light emitting device of claim 8, wherein each organic light emitting layer comprises:
    a hole transfer layer;
    an active layer arranged on the hole transfer layer; and
    an electron transfer layer arranged on the active layer.

10. The light emitting device of claim 8, wherein each substrate comprises glass or a plastic.

11. The light emitting device of claim 8, wherein each mesh shaped anode comprises a metal selected from the group consisting of Ni, Au, Ag, Pt, and Cu.

12. The light emitting device of claim 8, wherein each mesh shaped anode comprises a metal having a work function greater than 4.8 eV.

13. The light emitting device of claim 8, wherein each mesh shaped anode and mesh shaped cathode are formed by a wet process.

14. The light emitting device of claim 13, wherein the wet process comprises:
    forming an optical catalyst film by coating an optical catalyst material on a substrate;
    forming a water soluble polymer layer by coating a water soluble polymer compound on the optical catalyst film;
    producing a latent pattern of nuclei for growing crystals by selectively exposing the optical catalyst film and the water soluble polymer layer; and
    producing a metal pattern by plating the latent pattern of nuclei, and growing metal crystals.

* * * * *